(12) United States Patent
Debucquoy et al.

(10) Patent No.: US 8,247,801 B2
(45) Date of Patent: Aug. 21, 2012

(54) ORGANIC SEMI-CONDUCTOR PHOTO-DETECTING DEVICE

(75) Inventors: Maarten Debucquoy, Bruges (BE); Stijn Verlaak, Tongeren (BE); Paul Heremans, Leuven (BE)

(73) Assignees: IMEC, Leuven (BE); Katholieke Universiteit Leuven R&D, K.U. Leuven R&D, Leuven (BE)

( * ) Notice: Subject to any disclaimer, the term of this patent is extended or adjusted under 35 U.S.C. 154(b) by 778 days.

(21) Appl. No.: 11/729,577

(22) Filed: Mar. 29, 2007

(65) Prior Publication Data

US 2007/0235753 A1 Oct. 11, 2007

Related U.S. Application Data

(60) Provisional application No. 60/788,445, filed on Mar. 31, 2006.

(51) Int. Cl.
*H01L 29/08* (2006.01)

(52) U.S. Cl. .............. 257/40; 438/82; 438/99; 136/263

(58) Field of Classification Search ............... 257/113, 257/184, 431, 40, E51.001–E51.052; 438/82, 438/99; 136/263; *H01L 29/417, 31/111, H01L 29/74, 51/42*
See application file for complete search history.

(56) References Cited

U.S. PATENT DOCUMENTS

| | | | | |
|---|---|---|---|---|
| 5,063,126 A | * | 11/1991 | Nakatani et al. | 430/58.45 |
| 5,596,208 A | * | 1/1997 | Dodabalapur et al. | 257/66 |
| 5,652,067 A | * | 7/1997 | Ito et al. | 428/690 |
| 6,150,668 A | * | 11/2000 | Bao et al. | 257/40 |
| 6,194,740 B1 | * | 2/2001 | Zhang et al. | 257/59 |

(Continued)

FOREIGN PATENT DOCUMENTS

EP 236526 * 9/1987

(Continued)

OTHER PUBLICATIONS

Hamilton, Michael C. et al., "Organic Polymer Thin-Film Transistor Photosensors", IEEE Journal of Selected Topics in Quantum Electronics, vol. 10, No. 4, Jul./Aug. 2004, pp. 840-848.

(Continued)

*Primary Examiner* — Kiesha Bryant
*Assistant Examiner* — Mark Tornow
(74) *Attorney, Agent, or Firm* — McDonnell Boehnen Hulbert & Berghoff LLP

(57) ABSTRACT

An organic photo-detecting field-effect device is presented, the device comprising a first layer comprising an organic semi-conducting material, the first layer acting as an accumulation layer and as a charge transport layer for a first type of charge carriers, and a second layer comprising a second material, the second layer acting as a an accumulation layer for a second type of charge carriers. Charges collected in the second layer influence the charge transport in the first layer. The second material may be an organic semi-conducting material or a metal. At the interface between the first layer and the second layer a heterojunction is formed in the case of an organic semi-conducting second material, and a Schottky barrier is formed in the case of a metal second material, giving rise to an efficient exciton splitting. Different geometries and operation modes facilitating the removal of the collected photo-generated charge carriers during the reset period of the device are presented. Furthermore, a method for operating an organic photo-detecting field-effect device is provided.

11 Claims, 10 Drawing Sheets

U.S. PATENT DOCUMENTS

| | | | | |
|---|---|---|---|---|
| 6,278,127 | B1 * | 8/2001 | Dodabalapur et al. | 257/40 |
| 6,486,601 | B1 * | 11/2002 | Sakai et al. | 313/504 |
| 6,603,139 | B1 * | 8/2003 | Tessler et al. | 257/40 |
| 6,992,322 | B2 * | 1/2006 | Narayan | 257/40 |
| 7,119,366 | B2 * | 10/2006 | Kondoh | 257/59 |
| 7,504,049 | B2 * | 3/2009 | Tsutsui et al. | 252/500 |
| 7,868,319 | B2 * | 1/2011 | Adachi et al. | 257/40 |
| 2002/0020892 | A1 * | 2/2002 | Shima | 257/432 |
| 2002/0109136 | A1 * | 8/2002 | Seo et al. | 257/40 |
| 2003/0218166 | A1 * | 11/2003 | Tsutsui | 257/40 |
| 2005/0211976 | A1 * | 9/2005 | Redecker et al. | 257/40 |
| 2006/0160280 | A1 * | 7/2006 | Suh et al. | 438/149 |
| 2007/0034777 | A1 * | 2/2007 | Tuckerman et al. | 250/208.1 |
| 2007/0082140 | A1 * | 4/2007 | Suzuki et al. | 427/402 |
| 2007/0096085 | A1 * | 5/2007 | Rand et al. | 257/40 |
| 2008/0142789 | A1 * | 6/2008 | Suganuma | 257/40 |
| 2009/0212281 | A1 * | 8/2009 | Adachi et al. | 257/40 |

FOREIGN PATENT DOCUMENTS

| | | | |
|---|---|---|---|
| EP | 0236526 | * | 9/1987 |
| WO | WO 2004068267 | A2 * | 8/2004 |

OTHER PUBLICATIONS

Narayan, K.S. et al., "Light Responsive Polymer Field-Effect Transistor", Applied Physics Letters, vol. 79, No. 12, Sep. 17, 2001, pp. 1891-1893.

Noh, Yong-Young et al., "Highly Sensitive Thin-Film Organic Phototransistors: Effect of Wavelength of Light Source on Device Performance", Journal of Applied Physics, vol. 98, 2005, pp. 074505-1-074505-7.

Zukawa, Takehiro et al., "Organic Heterojunction Phototransistor", Journal of Applied Physics, vol. 91, No. 3, Feb. 1, 2002, pp. 1171-1174.

* cited by examiner

ORGANIC SEMI-CONDUCTOR PHOTO-DETECTING DEVICE

This application claims the priority of U.S. Provisional Patent Application No. 60/788,445, filed Mar. 31, 2006.

BACKGROUND

The present disclosure relates to organic electronics, in particular to organic photo-detecting devices, more in particular to organic photo-detecting field-effect devices. The present disclosure is furthermore related to a method for operating such devices. Organic photo-detecting field-effect devices in accordance with this disclosure may for example be used in large area image sensor arrays or in other large area electronic devices or circuits.

In the last decade, a lot of progress has been made in the development of electronic devices based on organic semiconductors. Organic semiconductors and organic electronic devices are gaining interest for a number of reasons. Because of their ease of manipulation and processing at low temperatures, organic semiconductors can be processed on large area, flexible and transparent substrates. Because of the relatively low processing cost and the relatively low material cost of organic semiconductors, organic devices offer potentially a cost advantage over inorganic devices. In addition, the wide range in the molecular structure of organic semiconductors offers a substantial flexibility in their functionality. For example, the wavelength at which an organic emissive molecule emits light may generally be tuned by changing the side groups of the molecule. Currently, organic molecular and polymer semiconductors are used to realize, for example, field-effect transistors, light emitting devices, photovoltaic cells and photodetectors.

Large area image sensor arrays may be obtained by providing an array of organic photodetectors on a large area substrate. The substrate may be flexible to enable imaging of curved structures. An all-organic image sensor array may be achieved by integrating on the same substrate organic field-effect transistors, able to process the read-out signals of the photodetectors.

Organic photodetectors can be classified in two main groups: two-terminal photodiodes and three-terminal phototransistors.

Organic photodiodes are realized by sandwiching one or more appropriate organic layers between two conductive electrodes. Incoming light is absorbed, giving rise to the generation of excitons, being coulombic bound electron-hole pairs. Excitons are then split into free electrons and free holes, whereby the free electrons move towards the positively biased electrode, and the free holes move towards the negatively biased electrode. The organic layers are optimized to maximize the absorption of photons, the splitting of photo-generated excitons into free charge carriers and the collection of the free charge carriers at the electrodes. In these structures there is no amplification of the photocurrent and the optical-to-electrical gain is limited.

Phototransistors are based on the same principles as photodiodes, but they combine light detection and signal amplification in a single device. Due to their amplifying action, they have a higher optical-to-electrical gain and thus a higher light sensitivity than photodiodes.

A first type of organic phototransistors is the organic bipolar phototransistor as for example reported by Zukawa T., Naka S., Okada H. and Onnagawa H., in "Organic heterojunction phototransistor", J. Appl. Phys. 91, 1171 (2002), where the photocurrent is amplified by a current-to-current amplification. These devices have at least three organic layers: an emitter layer, a base layer and a collector layer, between two conductive electrodes: a collector electrode and an emitter electrode. A forward voltage is applied to the collector with respect to the emitter. Light absorption gives rise to the generation of electron-hole pairs in the emitter, base and collector layers. These electron-hole pairs are split into free charge carriers under the influence of the electric field. Accumulation of one type of charge carriers in the base layer is obtained by an appropriate energy band design, e.g. by means of appropriate doping profiles or by means of organic heterojunctions. This accumulation of charge carriers facilitates and enhances the carrier injection from emitter to base and amplifies the current going through all three organic layers. Optimization of these devices includes the maximization of the enhanced injection from emitter to base.

A second type of organic phototransistors is the organic field-effect phototransistor. In organic field-effect phototransistors the photocurrent is amplified by the transconductance of the field-effect transistor. Typical organic field-effect phototransistors have a structure with three conductive electrodes, a source electrode, a drain electrode and a gate electrode, and one organic semi-conducting material (Narayan K. S. and Kumar N., "Light responsive polymer field-effect transistor", Appl. Phys. Lett. 79, 1891 (2001); Hamilton M. C., Kanicki J., "Organic polymer thin-film transistor photosensors", IEEE J. Select. Topics Quantum Electron. 10, 840 (2004); Noh Y. Y., Kim D. Y. and Yase K., "Highly sensitive thin-film organic phototransistors: effect of wavelength of light source on device performance", J. Appl. Phys. 98, 074505 (2005)). Organic field-effect phototransistors, when operated in the off-state of the field-effect transistor, show higher gain and signal-to-noise ratio as compared to organic photodiodes and organic bipolar phototransistors. Moreover, integration of organic field-effect phototransistors and organic field-effect transistors in a circuit is more straightforward compared to other organic photodetectors thanks to their similar structure. Pixel design in an image sensor array can be simplified for the same reason.

When using the organic field-effect transistor for example as an image sensor, its operation is characterized by a charging period, a read-out period and a reset period. During the charging period the device is illuminated such that excitons are created in the organic material and subsequently split into free charge carriers. Once generated, these free charge carriers move under the influence of the applied electric fields through the channel of the transistor. One type of charge carriers is trapped in deep charge carrier traps within the structure of the device. This accumulation of trapped charge carriers causes a shift in the threshold voltage of the field-effect phototransistor, which is translated into an amplified current through the device between source and drain. During the reset period, after switching off the photo-excitation, the trapped charges are removed to prepare the device to be recharged during the next charging period.

To reach a high gain, an efficient photo-generation of free charge carriers, an excellent field-effect transistor characteristic and an efficient trapping of one type of charge carriers are required. However, controlled operation of organic field-effect phototransistors has been problematic due to the difficult control of the (deep) charge carrier traps which define the photo-response characteristics of the device. Furthermore, as charge carriers are trapped in deep charge carrier traps, removing the trapped charges during the reset period is a time consuming process. It has been observed that, after switching off the photo-excitation, the current persists at a higher value than the initial dark current, and the recovery to the initial dark current is characterized by an extremely slow relaxation process that may take several hours.

SUMMARY

The present specification discloses a type of organic photo-detecting device—more particularly an organic field-effect photo-detecting device—wherein the device structure includes a first organic semi-conducting layer acting as a transport layer and a second layer providing good control of accumulated charge carriers enhancing the conductivity in the organic semi-conducting layer. This second layer may, for example, be an organic semi-conducting layer or a metal layer. Furthermore, a method for facilitating the removal of accumulated charge carriers during the reset period of the device is disclosed.

Some embodiments of the organic photo-detecting field-effect devices described herein can provide certain advantages over single layer organic field-effect phototransistors known in the prior art. The structure of devices disclosed herein, with a first organic semi-conducting layer and a second layer, the second layer being an organic semi-conducting layer or a metal layer, allows harvesting of more free carriers from a given amount of photo-generated excitons than is generally possible in a single layer organic field-effect phototransistor. The reason is that exciton splitting is a more efficient process at a heterojunction between two organic materials, as is the case with an organic semi-conducting second layer, or in the neighbourhood of the electric field of a Schottky contact, as is the case with a metal second layer. Furthermore, in organic field-effect devices as described herein, the build-up of charge carriers is realized in the second layer. As these charge carriers are not trapped in deep charge carrier traps, the charge carriers may even move freely through the second layer, and their removal during the reset period of the device may go faster than in prior art solutions, as a smaller energy step needs to be overcome to free the accumulated charge carriers. An additional advantage of devices as disclosed herein is that the first layer and the second layer may be optimized separately. The second layer may be optimized to harvest photons with a predetermined wavelength, whereas the first layer may be optimized for the transport of the current between the source electrode and the drain electrode.

Organic photo-detecting field-effect devices disclosed herein include a first layer comprising a first organic semi-conducting material, the first organic semi-conducting material having a high charge carrier mobility (preferably higher than $10^{-3}$ cm$^2$/Vs) for a first type of charge carriers, a source electrode in electrical contact with the first layer, a drain electrode in electrical contact with the first layer and physically separated from the source electrode, the source electrode and the drain electrode delineating a channel region in the first layer, and a second layer comprising a second material, the second layer being in electrical contact with the first layer at least in the channel region, the second layer not being in electrical contact with the source electrode. The second material may be a conducting or a semi-conducting material. In the context of the present disclosure, there being no electrical contact between the second layer and the source electrode means that there is an energy barrier obstructing charge carrier exchange over the interface between the second layer and the source electrode. The energy levels of the first semi-conducting material and the second material are selected such that an energy barrier is formed at the interface between the first layer and the second layer. This energy barrier prevents the flow of the first type of charge carriers form the first layer to the second layer and it prevents the flow of a second type of charge carriers from the second layer to the first layer, the second type of charge carriers having the opposite charge of the first type of charge carriers. In an organic photo-detecting field-effect device according to embodiments disclosed herein, excitons are photo-generated upon illumination and split into free charge carriers of the first type and the second type. The second layer may then accumulate the second type of charge carriers and the first layer may accumulate the first type of charge carriers and transport the first type of charge carriers between the source electrode and the second electrode.

The second material may be a second organic semi-conducting material, forming an organic heterojunction at the interface between the first layer and the second layer, or it may be a metal forming a Schottky barrier at the interface between the first layer and the second layer.

The energy levels of the first layer and the second layer may be selected such that efficient exciton splitting in the first type of charge carriers and the second type of charge carriers takes place at the interface between the first layer and the second layer. Efficient exciton splitting implies that the energy of a photo-generated exciton is larger than the sum of the energy of a charge carrier of the first type in the first layer and the energy of a charge carrier of the second type in the second layer.

The interface between the first layer and the layer may be an essentially planar junction. In another embodiment disclosed herein, the interface between the first layer and the second layer may be a bulk junction, being a three-dimensional network wherein the first material and the second material are intermixed.

An organic photo-detecting field-effect device as disclosed herein may further comprise a gate insulator in contact with at least one of the first layer and the second layer, and a gate electrode in contact with the gate insulator and electrically isolated from the source electrode, the drain electrode, the first layer and the second layer.

An organic photo-detecting field-effect device as disclosed herein may further comprise a structure for removing the second type of charge carriers from the second layer during the reset period of the device, such as for example a reset electrode in electrical contact with the second layer.

The source electrode may be a first fork-shaped structure and the drain electrode may be a second fork-shaped structure, with the first fork-shaped structure and the second fork-shaped structure forming an interdigitated fork structure.

An organic photo-detecting field-effect device as disclosed herein may be operated with a charging period, a read-out period and a reset period. During the charging period, the device is illuminated such that excitons are created and subsequently split into free charge carriers, whereby the first type of charge carriers is accumulated in the first layer and the second type of charge carriers is accumulated in the second layer. During the read-out period, appropriate voltages are applied to the electrodes such that a current flows between the source electrode and the drain electrode through the first layer. This current is dependent on the amount of charge carriers accumulated in the first layer, and is therefore a measure for the power and the time of the illumination on the device. The second type of charge carriers accumulated in the second layer may thereby enhance the conductivity of the first layer in the channel region between the source electrode and the drain electrode. During the reset period, after switching off the illumination, the charges accumulated in the second layer are removed to prepare the device for the next charging period.

A method for operating an organic photo-detecting field-effect device is disclosed, where the device comprises a first organic semi-conducting layer, a source electrode and a drain electrode in electrical contact with the first layer, a second layer in electrical contact with the first layer and not in electrical contact with the source electrode, there being an energy barrier at the interface between the first layer and the second layer. The method includes illuminating the organic photo-detecting field-effect device, thereby inducing the formation of excitons in at least one of the first layer and the second layer; inducing splitting of the excitons at the energy barrier into a first type of charge carriers and a second type of charge carriers, the second type of charge carriers having opposite charge when compared to the first type of charge carriers, thereby accumulating the first type of charge carriers in the first layer and accumulating the second type of charge carriers in the second layer; and applying an appropriate voltage to the source electrode and to the drain electrode, thereby inducing transportation of the first type of charge carriers towards the drain electrode while keeping the second type of charge carriers accumulated in the second layer. The second type of charge carriers is attracted towards the source electrode, but remains in the second layer as this second layer is not in electrical contact with the source electrode and as the energy barrier between the first layer and the second layer prevents the second type of charge carriers to be injected into the first layer and to be subsequently transported through this first layer towards the source electrode. The accumulation of charge carriers of the second type in the second layer then influences the transport of charge carriers of the first type in the first layer, such that additional charge carriers of the first type are injected from the source electrode into the first layer and transported through the first layer towards the drain electrode, giving rise to an enhanced source-drain current.

The organic photo-detecting device may furthermore comprise a gate insulator in contact with at least one of the first layer and the second layer, and a gate electrode in contact with the gate insulator, the gate electrode being electrically isolated from the source electrode, the drain electrode, the first layer and the second layer. The advantage of a gate electrode may be the possibility of assisting the exciton splitting of photo-induced excitons by applying an appropriate voltage to the gate electrode. An appropriate gate voltage may also be applied to the gate electrode during read-out. The read-out period involves the application of an appropriate voltage to the gate electrode, the source electrode and the drain electrode. The current flowing between the source electrode and the drain electrode through the first layer upon the application of these voltages, depends on the amount of charge carriers accumulated in the second layer. As such, this current is a measure for the power and the time of the illumination on the device. At a certain gate voltage the difference in source-drain current between an illuminated and a non-illuminated device may be maximum, in this way optimizing the sensitivity of the photo-detecting device. An appropriate voltage may also be applied to the gate electrode during the reset period of the device to fasten the removal of the charge carriers of the second type from the second layer.

The method for operating the organic photo-detecting device may then further comprise applying a voltage to the gate electrode to facilitate splitting of excitons into the first type of charge carriers and the second type of charge carriers. Furthermore, the method may comprise applying a voltage to the gate electrode to facilitate transportation of the first type of charge carriers between the source electrode and the drain electrode.

Such a method for operating an organic photo-detecting field-effect device may further comprise removing the second type of charge carriers form the second layer (during the reset period). Removing the second type of charge carriers from the second layer may, for example, comprise selecting a wavelength within the absorption spectrum of at least one of the first layer and the second layer, illuminating the photo-detecting device with light of the selected wavelength, thereby inducing photo-generation of charge carriers or excitons, and inducing recombination of the second type of charge carriers with these photo-generated charge carriers or excitons.

The organic photo-detecting device may furthermore comprise a reset electrode in electrical contact with the second layer. Removing the second type of charge carriers from the second layer may then comprise applying to the reset electrode a voltage attracting the second type of charge carriers, such that the second type of charge carriers are removed through the reset electrode.

According to another embodiment, removing the second type of charge carriers from the second layer may comprise applying a voltage to at least one of the gate electrode, the source electrode and the drain electrode, thereby inducing transportation of the second type of charge carriers from the second layer to the first layer, and inducing recombination of the second type of charge carriers with charge carriers of the first type or inducing removal of the second type of charge carriers through at least one of the source electrode and the drain electrode.

In an alternative embodiment, removing the second type of charge carriers from the second layer may comprise applying a voltage to at least one of the gate electrode, the source electrode and the drain electrode, thereby inducing transportation of the first type of charge carriers from the first layer to the second layer, and inducing recombination of the second type of charge carriers with charge carriers of the first type.

In yet another embodiment, the method for operating an organic photo-detecting field-effect device may comprise applying a voltage to at least one of the gate electrode, the source electrode and the drain electrode, to overcome the energy barrier between the second layer and the source electrode and/or the drain electrode, and inducing removal of the second type of charge carriers by at least one of the source electrode and the drain electrode.

Organic photo-detecting field-effect devices as described herein may be used for example as a pixel sensor in image sensors, e.g. in cameras, scanners or image sensor arrays for medical or industrial applications.

Particular and preferred aspects of the invention can be found in the independent and dependent claims. Features of the dependent claims may be combined with features of the independent claims and with features of other dependent claims as appropriate and not merely as explicitly set out in the claims.

The above and other characteristics, features, and advantages of the methods and devices disclosed herein will be clarified in the following detailed description in combination with the drawings, which illustrate, by way of example, the principles of the invention. This description is given as an example only, without limiting the scope of the invention.

DETAILED DESCRIPTION

Figure 1:
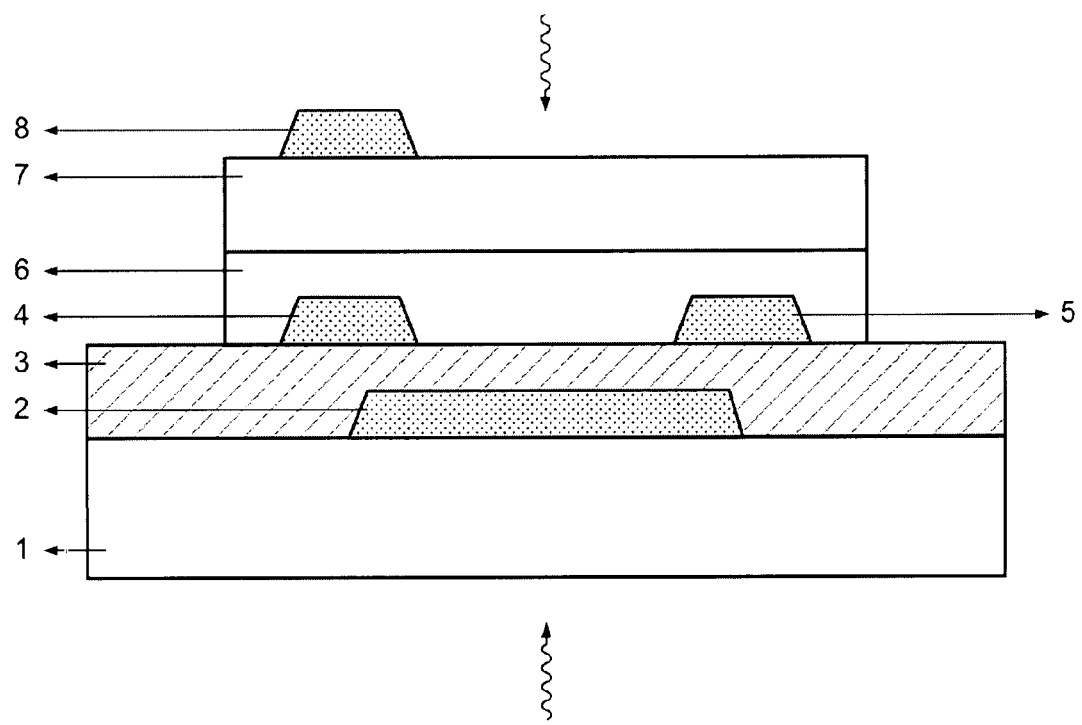
FIG. 1 is a cross-sectional view of an organic photo-detecting field-effect device, wherein 1 is the substrate, 2 is the gate electrode, 3 is the gate insulator, 4 is the source electrode, 5 is the drain electrode, 6 is the first layer or charge transport layer, 7 is the second layer or photogate layer, and 8 is the reset electrode.

The present invention will be illustrated through the description of particular embodiments, and with reference to certain drawings, but the invention is not limited to such embodiments and drawings, but rather is defined by the appended claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances, and the embodiments described herein can operate in other orientations than described or illustrated herein.

The term "comprising", used in the claims, should not be interpreted as restricting the claims to the elements listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B.

The present disclosure relates to a type of organic photo-detecting device, more particularly an organic photo-detecting field-effect device, wherein the device structure comprises a first organic semi-conducting layer acting as a transport layer and an additional layer providing good control of accumulated charge carriers which enhance the conductivity of the transport layer. Furthermore, the present disclosure provides a method for facilitating the removal of accumulated charge carriers.

The structure of one such organic photo-detecting device is shown in FIG. 1 and in FIGS. 3 to 8. The device comprises a source electrode (4) and a drain electrode (5), a first organic semi-conducting layer, called the transport layer (6), and a second layer (7) in contact with the transport layer (6), but not in electrical contact with the source electrode (4), and with well chosen energy levels, called the photogate layer (7). Furthermore a gate electrode (2) on a substrate (1) and a gate insulator (3) covering the substrate (1) and the gate electrode (2) may be present. In certain embodiments, the device may comprise an extra electrode, called the reset electrode (8), contacting the photogate layer (7). The photogate layer (7) may be an organic semi-conducting layer forming an organic heterojunction with the transport layer (6) or a metal layer forming a Schottky barrier with the transport layer (6). The energy levels of the photogate layer material (7) and the transport layer material (6) are selected such that after splitting of the photo-induced excitons, a first type of charge carriers is collected in the transport layer (6) and a second type of charge carriers having opposite charge is collected in the photogate layer (7). Additionally the energy levels are such that injection of the first type of charge carriers into the photogate layer (7), and injection of the second type of charge carriers into the transport layer (6) is obstructed.

The transport layer (6) material and/or the photogate layer (7) material are selected such that they absorb light in a preferred part of the light spectrum. In the case of a metal photogate layer, absorption in the transport layer is preferred. To avoid absorption in the metal photogate layer, the photogate layer may be made transparent or translucent or the device may be illuminated in such a way that the photogate layer does not shield the transport layer from illumination.

Upon illumination, excitons are generated and split into free electrons and free holes. The photo-generated electrons are collected by the transport layer (6) and the photo-generated holes are collected by the photogate layer (7), or vice versa, the photo-generated electrons are collected by the photogate layer (7) and the photo-generated holes are collected by the transport layer (6). During the read-out period the photo-generated charge carriers collected in the transport layer (6) can be readily transported to the drain electrode (5) if this drain electrode (5) is biased with respect to the source electrode (4) to attract this type of charge carriers. The gate electrode (2) may be biased to attract the type of charge carriers collected in the transport layer (6) in order to facilitate the transport towards the drain electrode (5). The reset electrode (8) may be left floating during this stage of operation. The organic semi-conducting material of the transport layer (6) preferably has a high charge carrier mobility (preferably higher than $10^{-3}$ cm$^2$/Vs) for the type of charge carriers collected in this layer.

The configuration is such that during the charging period of the organic semiconductor photo-detecting device, the photo-generated charge carriers collected in the photogate layer (7), are prevented from directly flowing to the source electrode (4) and the drain electrode (5). As the charge carriers accumulated in the photogate layer (7) have the opposite charge of the mobile charge carriers collected in the transport layer (6), they are attracted towards the source electrode (4). As the photogate layer (7) is not in electrical contact with this source electrode (4) these carriers can not directly flow from the photogate layer (7) to the source electrode (4). Furthermore, the energy barrier at the interface between the photogate layer (7) and the transport layer (6), which is a result of the positions of their energy levels, prevents the injection of the charge carriers collected in the photogate layer (7) into the transport layer (8). The charge carriers collected in the photogate layer (7) enhance the conductivity of the transport layer (6) between the source electrode (4) and the drain electrode (5).

During the reset period of the device, the charge carriers collected in the photogate layer (7) are removed. Several methods may be employed for this. In a first embodiment, a reset electrode (8) contacting the photogate layer (7) may be provided and an appropriate voltage may be applied to this reset electrode, such that the charge carriers collected in the photogate layer (7) are transported within this photogate layer and are removed from this photogate layer towards the reset electrode. In another embodiment, an appropriate voltage may be applied to the source electrode (4) and/or the drain electrode (5) and/or the gate electrode (2), such that the charge carriers collected in the photogate layer (7) are removed from the photogate layer (7), involving transport of charge carriers through the transport layer (6). In yet another embodiment, an appropriate voltage may be applied to the source electrode (4) and/or the drain electrode (5) and/or the gate electrode (2), such that the charge carriers collected in the photogate layer (7) are transported within this layer and are no longer blocked by an energy barrier from the source electrode (4), the drain electrode (5) or both electrodes, such that they may be removed from the photogate layer (7) by the source electrode (4), the drain electrode (5) or both electrodes without involving transport of charge carriers through the transport layer (6). In yet another implementation, the charge carriers collected in the photogate layer (7) may be removed by optical means, for example by illumination of the device with light of an appropriate wavelength that is within the absorption spectrum of the layer in which charges are trapped. The intensity of the incident light and the exposure time are selected such that a sufficiently high photon flux is absorbed in the material. Removal of charge carriers is then obtained by recombination of trapped charges with photo-induced charge carriers or with excitons. Combinations of the above are also possible, whereby for example the charges collected in the photogate layer (7) are removed by the source electrode (4) and the drain electrode (5), and in addition recombine with opposite charge carriers. Resetting with optical means may be a disadvantage in practical applications. Resetting by applying appropriate voltages to the source electrode (4) and/or the drain electrode (5) and/or the gate electrode (2) may require high voltages. Resetting by a reset electrode (8) may slow down the charging of the photogate layer (7) during the charging period, as the reset electrode (8) needs to be charged too.

Some embodiments of organic photo-detecting field-effect devices as described herein may several advantages over prior-art single layer organic field-effect phototransistors. During the charging period of devices described herein, photons are absorbed in the transport layer (6) and/or in the photogate layer (7) to form excitons. If an organic semiconducting material is used for the photogate layer (7), the excitons may be split into free charge carriers at the organic heterojunction between the photogate layer (7) and the transport layer (6), which is a more efficient process than exciton splitting in the bulk of an organic semiconductor. If a metal is used for the photogate layer (7), the exciton splitting may be enhanced by the electric field of the Schottky barrier between the photogate layer (7) and the transport layer (6). Therefore, the structure of these devices allows harvesting more free carriers from a given amount of generated excitons than is generally achieved in a prior-art single layer organic field-effect phototransistor. Furthermore, in organic photo-detecting field-effect devices as disclosed herein, a build-up of charge carriers is realized in the photogate layer (7). As these charge carriers are not trapped in deep charge carrier traps, the trapped charge carriers may move freely through the photogate layer (7), and the removal of the trapped charge carriers during the reset period may go faster than in prior art devices that use deep charge carrier traps, as a smaller energy step needs to be overcome. An additional advantage is that the photogate layer (7) and the transport layer (6) may be optimized separately. The photogate layer (7) may be optimized to harvest photons with a predetermined wavelength, whereas the transport layer (6) may be optimized for the transport of the current between the source electrode (4) and the drain electrode (5).

The devices disclosed herein have a structure that is similar to the structure of an organic heterojunction (non-photo-detecting) field-effect transistor; however, the function of the layers forming the heterojunction is different in both devices. In the devices as disclosed herein, a heterojunction is formed between a first layer acting as a transport layer and a second layer acting as a charge-collecting layer. The structure of the device and the voltages applied during the charging period are selected such that a flow of charge carriers between the source electrode (4) and the drain electrode (5) through the charge-collecting layer is prevented. In an organic heterojunction (non-photo-detecting) field-effect transistor, a heterojunction is formed between a first layer acting as a transport layer for a first type of charge carriers and a second layer acting as a transport layer for a second type of charge carriers, such that ambipolar charge transport is obtained. Additionally, in the devices disclosed herein, the photosensitivity of the materials used is an important feature, whereas this is not the case for non-photo-detecting devices.

In and organic photo-detecting field-effect device as described herein, different configurations for the interface between the transport layer (6) and the photogate layer (7) are possible. The interface between both layers may be essentially a planar junction between two materials. It may, in an alternative embodiment, also be a three dimensional network of two intermixed materials, called a bulk junction. The bulk junction offers a higher interface area between the transport layer (6) and the photogate layer (7). This has the advantage of a more efficient splitting of photogenerated excitons into free charge carriers. A possible drawback of the bulk junction implementation is the difficulty to prevent the collected charge carriers in the photogate layer (7) from escaping to the source electrode (4) and/or the drain electrode (5) during the charging period of the device.

The source electrode (4) and the drain electrode (5) may be placed at different positions with respect to the transport layer (6) and the photogate layer (7), but only in such a way that during the charging period of the device the collected charge carriers in the photogate layer (7) are prevented from escaping to the source electrode (4) or the drain electrode (5). For the source electrode (4) this means that there may not be an electrical contact between the source electrode (4) and the photogate layer (7). For the drain electrode (5), the voltage applied to this electrode may be sufficient to prevent charge carriers collected in the photogate layer (7) from escaping to the drain electrode (5).

The reset electrode (8) for removing the collected charge carriers from the photogate layer (7) during the reset period should form a good electrical contact with the photogate layer (7) and may be placed at different positions with respect to the other layers.

Below, various other embodiments of the invention are described. They will be described with reference to the accompanying drawings. It should be understood that the embodiments below are only a limited selection of all possible embodiments. Many other combinations and locations of transport layer, photogate layer, other semi-conducting layers, additional layers, insulating layers, source, drain, reset and gate electrode are possible.

FIG. 1 illustrates one particular embodiment. This embodiment may be fabricated as follows. An electrically conducting material may be deposited onto a substrate (1) to form a gate electrode (2), an electrically insulating material may be deposited onto the substrate (1) and the gate electrode (2) to form a gate insulator (3), an electrically conducting material may be deposited onto the gate insulator (3) and patterned to form a source electrode (4) and a drain electrode (5), a first organic semi-conducting material may be deposited onto the gate insulator (3), the source electrode (4) and the drain electrode (5) to form a transport layer (6), a second organic semi-conducting material or a metal may be deposited onto the transport layer (6) to form a photogate, layer (7), an electrically conducting material may be deposited onto the photogate layer (7) to form a reset electrode (8).

The term "substrate" may include any underlying material or materials that may be used, or upon which a device as described herein may be formed. The term "substrate" is thus used to define generally the elements for layers that underlie a layer or portions of interest. The material and the thickness of the substrate may be chosen to obtain the desired structural and optical properties. The substrate may be a rigid substrate or a flexible substrate. Plastic, glass and metal foils are examples of rigid substrate materials. Plastic and metal foils are examples of flexible substrate materials. A flexible substrate offers the possibility to image curved structures. The substrate may be transparent, translucent or opaque. A transparent substrate allows illumination of the device through the substrate. The substrate may be a structure comprising many materials such as insulators, semiconductors and metals, in which for example circuits are present.

A gate electrode (2) may be deposited onto the substrate (1). The gate electrode (2) may be any suitable metal or conductive material, for example a metal, a transparent conductive oxide, or a conductive polymer. Examples of metals are gold (Au), titanium (Ti), tungsten (W), silver (Ag), chromium (Cr), aluminum (Al), palladium (Pd), platinum (Pt), copper (Cu). Examples of transparent conductive oxides are indium tin oxide (ITO) and zinc oxide (ZnO). Examples of conductive polymers are a mixture of polyethylenedioxythiophene and poly(styrenesulfonate) (PEDOT:PSS) and polyaniline (PANI). The gate electrode (2) may be deposited by vacuum deposition, evaporated, sputtered, deposited from the liquid phase, deposited from solution or by another method without departing from the scope of the invention.

The gate electrode (2) may be transparent, translucent or opaque. A transparent gate electrode (2) allows illumination of the device through the substrate (1). Indium Tin Oxide (ITO) is an example of a transparent gate electrode (2). Thin layers (0.5-50 nm thickness) of titanium (Ti), tungsten (W) and gold (Au) are examples of a translucent gate electrode (2).

The gate electrode (2) may be a highly-doped semi-conducting material. This may facilitate the fabrication, as in this case the substrate material and the gate electrode material may be the same material.

During the charging period, the read-out period and the reset period the gate electrode (2) may be biased at a voltage appropriate to optimize the characteristics of the organic photo-detecting field-effect device. An appropriate voltage during the charging period may enhance the exciton splitting. An appropriate voltage during read-out may maximize the difference in drain-source current between an illuminated device and a non-illuminated device. An appropriate voltage during the reset period may hasten the removal of the accumulated charge carriers.

The organic photo-detecting field-effect device may be operated in the accumulation mode as well as in the cut-off mode, although the gain may be higher when operated in the cut-off mode. The transistor may also be operated in the inversion mode.

The gate insulator (3) may be deposited onto the gate electrode (2) and the substrate (1). The gate insulator (3) may be any suitable insulator, organic or inorganic. Polyimide (PI), poly-vinyl-phenol (PVP), and poly(a-methylstyrene) (PaMS) are examples of organic insulators. Silicon dioxide ($SiO_2$), silicon nitride ($Si_xN_y$), aluminium oxide ($Al_xO_y$), titanium oxide ($Ti_xO_y$) and tantalum oxide ($Ta_xO_y$) are examples of inorganic insulators.

The gate insulator (3) may for example be thermally grown, sputtered, formed by anodization, deposited from the liquid phase, or from solution.

The gate insulator (3) may be a stacked layer of multiple insulators. The gate insulator (3) may undergo a surface modification to improve the transport of charge carriers in the transport layer (6). A self-assembled monolayer of octadecyltrichlorosilane (OTS) is an example of a surface modification.

The source electrode (4) and the drain electrode (5) may be deposited onto the gate insulator (3). The source electrode (4) and the drain electrode (5) may be any suitable metal or conductive material and may for example be deposited by vacuum deposition or printing techniques. Gold (Au), silver (Ag), palladium (Pd), platinum (Pt), copper (Cu), aluminum (Al), titanium (Ti), tungsten (W), chromium (Cr) are examples of metals; indium tin oxide (ITO), zinc oxide (ZnO) and nickel oxide ($NiO_x$) are examples of conductive oxides. A mixture of polyethylenedioxythiophene and poly(styrene-sulfonate) (PEDOT:PSS) is an example of a conductive polymer.

An adhesion layer may be used to improve the adhesive properties of the source electrode (4) and the drain electrode (5). Titanium (Ti) and chromium (Cr) are examples of an adhesion layer. A doping layer may be used at the interface between the transport layer (6) and the source electrode (4) and/or the drain electrode (5) to reduce the contact resistance at the electrodes and in this way enhance the injection of charge carriers from the electrodes into the transport layer (6) and vice versa. Lithium fluoride (LiF) is an example of a doping layer.

The material composition of the source electrode (4) and the drain electrode (5) may be chosen such that the charge carriers collected in the photogate layer (7) during the charging period of the device, experience an energy barrier essentially preventing them from leaking from the photogate layer (7) to the source electrode (4) and the drain electrodes (5).

The source electrode (4) and the drain electrode (5) may take the form of an interdigitated fork structure to realize a high W/L-ratio, where W is the width of the channel region and L is de length of the channel region. The fingers of the forks may be between 0.1 µm and 100 µm thick and between 1 µm and 1000 µm long. The distance between a finger of the source electrode (4) and a finger of the drain electrode (5) may be between 0.1 µm and 1000 µm.

The transport layer (6) may be deposited onto the gate insulator (3), the source electrode (4) and the drain electrode (5). Various organic semi-conducting materials may be used for the transport layer (6), including polymeric materials and small molecule organic materials. In the context of this disclosure, small molecules are molecules with a molecular mass between 2 and 10,000. Preferably, the transport layer (6) is an organic semi-conducting material with high charge carrier mobility (preferably higher than $10^{-3}$ cm$^2$/Vs) for at least one type of charge carriers and a high subthreshold slope in a field-effect transistor configuration. Examples of such materials are pentacene, functionalised pentacene, copper phthalocyanine (CuPc), poly(3-hexylthiofeen) (P3HT), poly-triarylamnie (PTAA), naphthalene tetracarboxylic dianhydride (NTCDA), buckminster fullerene ($C_{60}$), NN'-ditridecylperylene-3,4,9,10 tetracarboxylic diimide (PDCTI-$C_{13}H_{27}$), perfluorinated copper-phthalocyanine ($F_{16}$CuPc) and [6,6]-phenyl $C_{61}$-butyric acid methyl ester (PCBM).

The conductivity in the transport layer (6) may be mainly due to hole conduction, "p-type" conductivity, or to electron conduction, "n-type" conductivity. P- or n-type conductivity may be achieved by doping the transport layer with suitable dopants, or may be a result of the configuration, as the interface with other materials may influence the mobility, and the material properties. Examples of dopants are tetrafluoro-tetracyanochinodimethan (F4-TCNQ) as molecular dopant and bromine (Br), calcium (Ca) and cesium (Cs) as atomic dopants.

The transport layer (6) may be deposited in a vacuum, for example with vacuum thermal evaporation or organic vapor phase deposition, from solution, for example with inkjet printing, flexography, gravure, spin-coating, blading, spraying. Other methods to deposit the transport layer (6) may be used without departing from the scope of the invention.

The photogate layer (7) may be deposited on the transport layer (6). In one embodiment, the material of the photogate layer (7) is an organic semi-conducting material, preferably with a high absorption within a certain region of the light spectrum. By replacing the material of the photogate layer by another material with another absorption spectrum, the organic photo-detecting device becomes sensitive to another wavelength or wavelength range of light. Various organic semi-conducting materials may be used for the photogate layer (7), including polymeric materials and small molecule organic materials. In the context of this disclosure small molecules are molecules with a molecular mass between 2 and 10,000. The organic semi-conducting photogate layer (7) may be p-type or n-type conductive.

The transport layer (6) and the photogate layer (7) are preferably selected such that at their heterojunction efficient exciton splitting takes place. This implies that the energy of the excitons should be larger than the sum of the energy of a charge carrier of the first type in the transport layer (6) and the energy of a charge carrier of the second type in the photogate layer (7). If the transport layer transports preferably holes, then the energy of the excitons should be larger then the sum of the energy of the highest occupied molecular orbital (HOMO) of the transport layer (6) and the energy of the lowest unoccupied molecular orbital (LUMO) of the photogate layer (7).

Figure 2A:
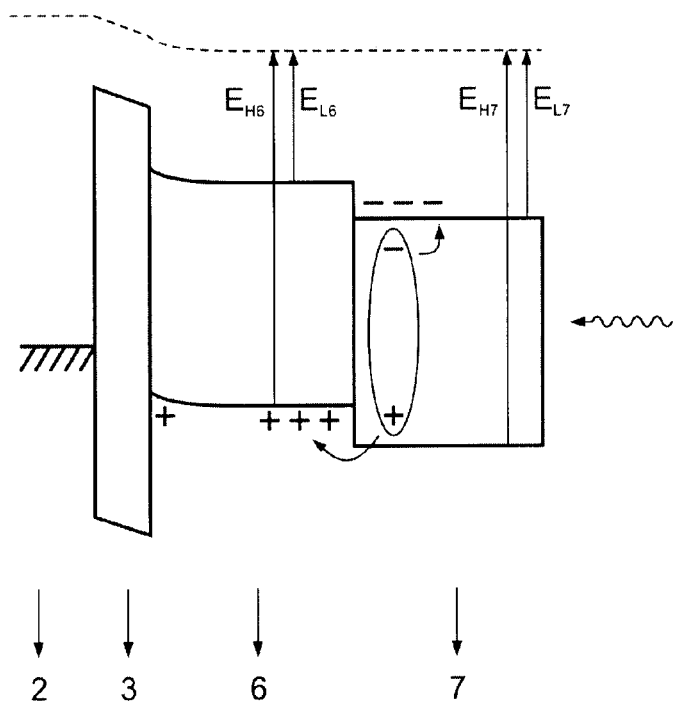
FIG. 2a is an energy band diagram for an organic photo-detecting field-effect device, where the transport layer (6) transports preferably holes and where the photogate layer (7) is an organic semi-conducting layer forming an organic heterojunction with the transport layer (6). 2 is the gate electrode and 3 is the gate insulator. $E_{H6}$ indicates the highest occupied molecular orbital (HOMO) of the transport layer (6), $E_{L6}$ the lowest unoccupied molecular orbital (LUMO) of the transport layer (6), $E_{H7}$ the HOMO of the photogate layer (7) and $E_{L7}$ the LUMO of the photogate layer (7).
Figure 2B:
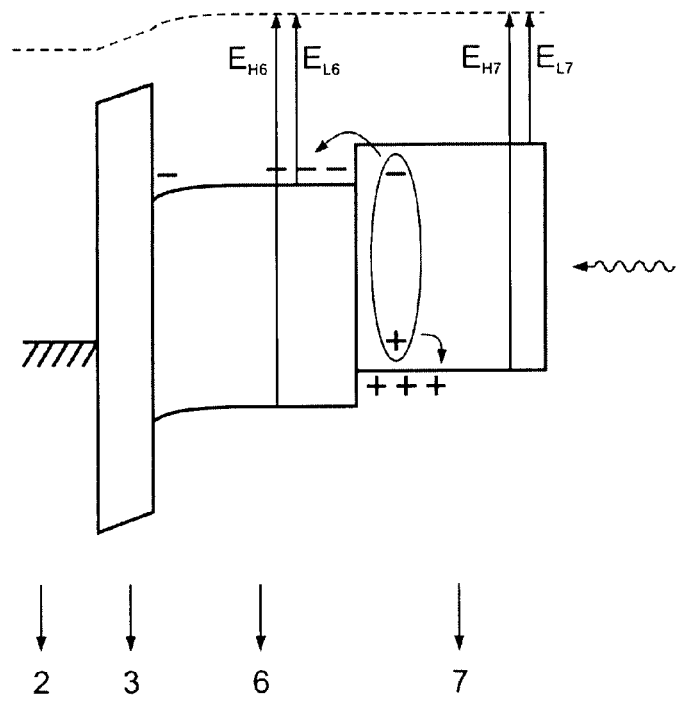
FIG. 2b is an energy band diagram for an organic photo-detecting field-effect device, where the transport layer (6) transports preferably electrons and where the photogate layer (7) is an organic semi-conducting layer forming an organic heterojunction with the transport layer (6). 2 is the gate electrode and 3 is the gate insulator. $E_{H6}$ indicates the highest occupied molecular orbital (HOMO) of the transport layer (6), $E_{L6}$ the lowest unoccupied molecular orbital (LUMO) of the transport layer (6), $E_{H7}$ the HOMO of the photogate layer (7) and $E_{L7}$ the LUMO of the photogate layer (7).

In addition, the energy levels of the organic semi-conducting transport layer (6) and the organic semi-conducting photogate layer (7) need to be such that during the charging period, there is a sufficiently high energy barrier preventing the charge carriers collected in the photogate layer (7) to leak to the transport layer (6). If the transport layer (6) transports preferably holes, the lowest unoccupied molecular orbital (LUMO) of the photogate layer material (7) is preferably deeper than the lowest unoccupied molecular orbital (LUMO) of the transport layer material (6), as shown in FIG. 2a. If the transport layer (6) preferably transports electrons, the highest occupied molecular orbital (HOMO) of the photogate material (7) is preferably smaller than the HOMO of the transport layer material (6), as shown in FIG. 2b.

The thicknesses of the transport layer (6) and the photogate layer (7) may be between 1 nm and 1000 nm. Advantages of using thinner layers are the enhanced influence of the accumulated charge carriers in the photogate layer (7) on the current in the transport layer (6) and the smaller distance between the place where excitons are generated and the place of enhanced exciton splitting (being the organic heterojunction or the Schottky contact). Excitons have a limited diffusion length, determining the distance an exciton can diffuse before being quenched. An advantage of using thicker layers is an increased photon absorption, as thicker layers can absorb more photons.

Preferably the collected charge carriers in the organic semi-conducting photogate layer (7) are mobile within the photogate layer (7) with a sufficiently high mobility to be easily removed during the reset period by the source electrode (4), the drain electrode (5), the reset electrode (8) or by a combination of these.

Examples of suitable organic semi-conducting photogate materials (7) are naphthalene tetracarboxylic dianhydride (NTCDA), buckminster fullerene ($C_{60}$), NN'-ditridecylperylene-3,4,9,10 tetracarboxylic diimide (PDCTI-$C_{13}H_{27}$), perfluorinated copper-phthalocyanine ($F_{16}$CuPc), [6,6]-phenyl $C_{61}$-butyric acid methyl ester (PCBM), pentacene, functionalised pentacene, copper phthalocyanine (CuPc), poly(3-hexylthiofeen) (P3HT) and poly-tri-arylamnie (PTAA). Possible combinations for the transport layer (6) and the photogate layer (7) are for example pentacene/PDCTI-$C_{13}H_{27}$, P3HT/PCBM and F16CuPc/CuPc.

Figure 2C:
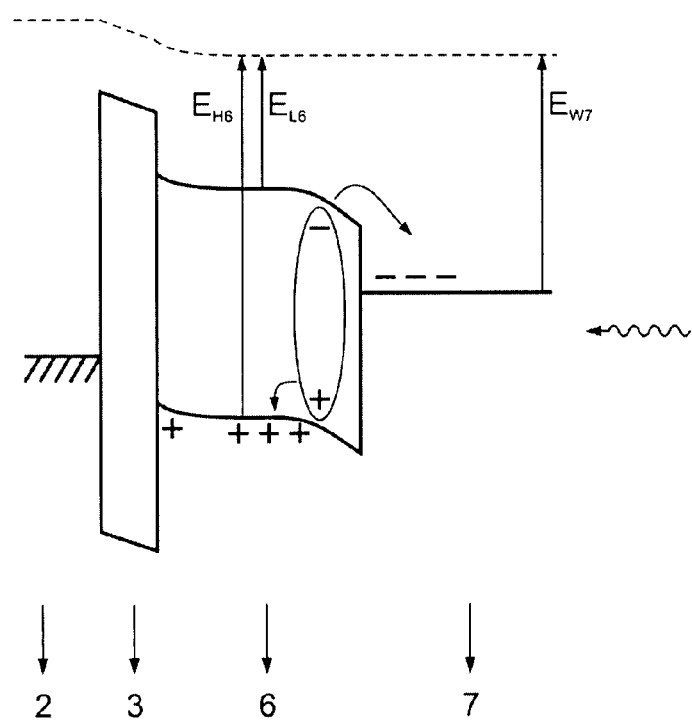
FIG. 2c is an energy band diagram for an organic photo-detecting field-effect device, where the transport layer (6) transports preferably holes and where the photogate layer (7) is a metal layer forming a Schottky barrier with the transport layer (6). 2 is the gate electrode and 3 is the gate insulator. $E_{H6}$ indicates the highest occupied molecular orbital (HOMO) of the transport layer (6), $E_{L6}$ the lowest unoccupied molecular orbital (LUMO) of the transport layer (6) and $E_{W7}$ the work function of the photogate layer (7).
Figure 2D:
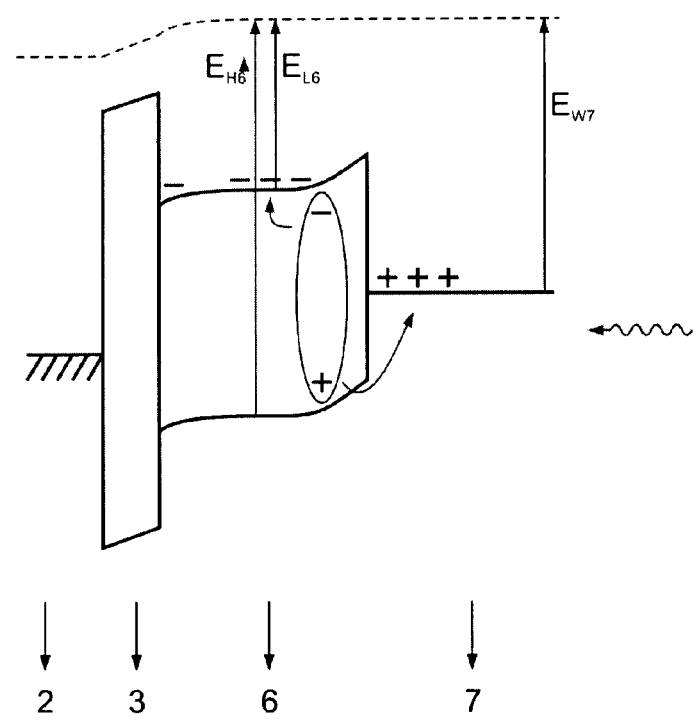
FIG. 2d is an energy band diagram for an organic photo-detecting field-effect device, where the transport layer (6) transports preferably electrons and where the photogate layer (7) is a metal layer forming a Schottky barrier with the transport layer (6). 2 is the gate electrode and 3 is the gate insulator. $E_{H6}$ indicates the highest occupied molecular orbital (HOMO) of the transport layer (6), $E_{L6}$ the lowest unoccupied molecular orbital (LUMO) of the transport layer (6) and $E_{W7}$ the work function of the photogate layer (7).

In another embodiment, the photogate layer (7) is a metal layer realizing a Schottky barrier with the transport layer (6). The Schottky barrier essentially prevents the collected charge carriers to leak to the transport layer as illustrated in FIG. 2c for a transport layer (6) transporting preferably holes and in FIG. 2d for a transport layer (6) transporting preferably electrons. Examples of suitable metal photogate materials are gold (Au), titanium (Ti), tungsten (W), silver (Ag), chromium (Cr), aluminum (Al), palladium (Pd), platinum (Pt), and copper (Cu). The metal photogate layer (7) may be sufficiently thin (0.5-50 nm) to be translucent and allow illumination from the top. The transport layer (6) may be doped to realize the Schottky barrier. The dopants may be molecular, for example tetrafluoro-tetracyanochinodimethan (F4-TCNQ), or atomic, for example bromine (Br), calcium (Ca) or cesium (Cs).

The photogate layer (7) may be patterned to confine the heterojunction or the Schottky barrier to a predefined area. Preferably the photogate layer (7) is patterned such that the charge carriers collected in the photogate layer (7) are confined to the region between the source electrode (4) and the drain electrode (5), called the channel region of the transport layer (6), as this is the region where the conductivity of the transport layer (6) may be enhanced. Also the transport layer (6) may be patterned.

A reset electrode (8) may be deposited on the photogate layer (7). The reset electrode (8) may be any suitable metal or conductive material, such as a metal, a transparent conductive oxide, or a conductive polymer. Examples of metals are gold (Au), titanium (Ti), tungsten (W), silver (Ag), chromium (Cr), aluminum (Al), palladium (Pd), platinum (Pt), and copper (Cu). Examples of transparent conductive oxides are indium tin oxide (ITO) and zinc oxide (ZnO). Examples of conductive polymers are a mixture of polyethylenedioxythiophene and poly(styrenesulfonate) (PEDOT:PSS) and polyaniline (PANI).

These materials may be deposited by vacuum deposition, evaporated, sputtered, deposited from the liquid phase or from solution without departing from the scope of the invention.

The reset electrode (8) is preferably placed close to the region of the transport layer (6) between the source electrode (4) and the drain electrode (5), called the channel region of the transport layer (6), to allow fast removing of the collected charge carriers from the photogate layer (7) during the reset period. If the reset electrode (8) is positioned right above the channel region of the transport layer (6), it may consist of a transparent material to allow illumination of the device from the top.

An adhesion layer may be used to improve the adhesive properties of the reset electrode (8). A doping layer may be used to reduce the contact resistance between the reset electrode (8) and the photogate layer (7), in this way facilitating the injection of charge carriers from the photogate layer (7) into the reset electrode (8) and vice versa. During the charging period of the organic photo-detecting field-effect device, the reset electrode may be left floating, and charge carriers may be collected in the photogate layer (7) or in the reset electrode (8) or in both. During the reset period of the organic photo-detecting field-effect device, a suitable voltage may be applied to the reset electrode (8) to remove the collected charge carriers from the photogate layer (7). In the case where the charge carriers collected in the photogate layer (7) are holes, a negative voltage may be applied to the reset electrode (8). In the case where the charge carriers collected in the photogate layer (7) are electrons, a positive voltage may be applied to the reset electrode (8). A combination of applying an appropriate voltage to the gate electrode (2) and/or the source electrode (4) and/or the drain electrode (5) and/or the reset electrode (8) may be used as well for resetting the organic photo-detecting field-effect device.

In another embodiment, the reset electrode (8) may be omitted, and during the reset period of the device an appropriate voltage may be applied to the gate electrode (2) and/or the source electrode (4) and/or the drain electrode (5) to remove the accumulated charge carriers from the photogate layer (7) by transport of charge carriers through the transport layer (6). At least two mechanisms are possible. In a first mechanism, the charge carriers collected in the photogate layer (7) may, during the reset period, be forced to the transport layer (6), where they can recombine with charge carriers of the opposite charge, or be swept to the source electrode (4), the drain electrode (5) or both electrodes, or a combination of both. In another mechanism, charge carriers with the opposite charge as compared with the charge carriers accumulated in the photogate layer (7) are swept to the photogate layer (7) and annihilate the charge carriers accumulated in the photogate layer (7). These charge carriers with opposite charge as compared with the charge carriers accumulated in the photogate layer (7) may be injected from the source electrode (4), the drain electrode (5) or from both electrodes, or from the transport layer (6).

In yet another embodiment, the reset electrode (8) may be omitted and during the reset period of the device an appropriate voltage may be applied to the source electrode (4) and/or the drain electrode (5) and/or the gate electrode (2) to overcome the energy barrier between the photogate layer (7) and the source electrode (4) or the drain electrode (5) or both electrodes, such that the charge carriers accumulated in the photogate layer (7) are removed by the source electrode (4), the drain electrode (5) or by both electrodes. This embodiment is different from the previous one, as no transport of charge carriers through the transport layer (6) is necessary to remove the accumulated charge carriers from the photogate layer (7).

In yet another embodiment, the reset electrode (8) may be omitted and during the reset period of the device, the charge carriers accumulated in the photogate layer (7) may be removed by optical means, for example by illumination of the device with light of an appropriate wavelength. When illuminating the device with light of an appropriate wavelength, excitons and free electron-hole pairs may be generated. The collected charge carriers in the photogate layer (7) may then be removed by recombination with opposite charge carriers or with excitons generated by the incident light.

When a metal is used for the photogate layer (7), the reset electrode (8) may be omitted and the photogate layer (7) may be used as the reset electrode (8).

Patterning of the different materials may be needed depending on the application. The transport layer (6) and the photogate layer (7) may be patterned for example by deposition through shadow masks, by deposition through integrated shadow masks, by photolithographic processes or by a printing process, more in particular an inkjet printing process.

Figure 3:
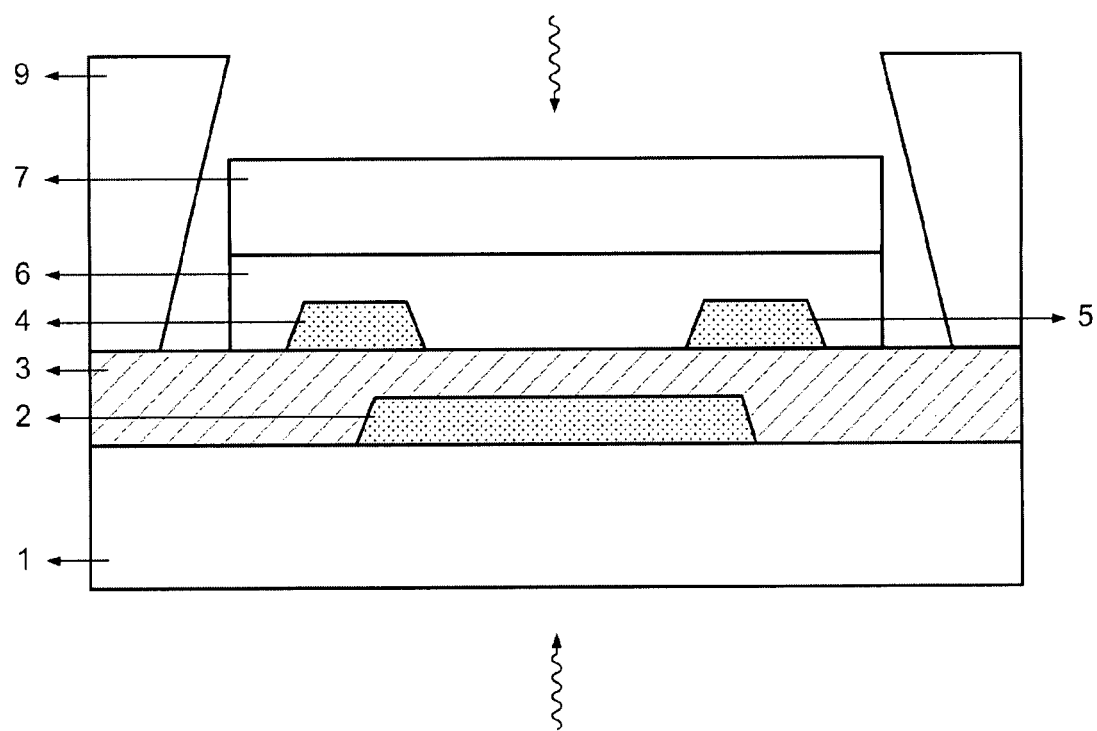
FIG. 3 is a cross-sectional view of an organic photo-detecting field-effect device, wherein 1 is the substrate, 2 is the gate electrode, 3 is the gate insulator, 4 is the source electrode, 5 is the drain electrode, 6 is the transport layer, 7 is the photogate layer and 9 is an integrated shadow mask.

An embodiment with an integrated shadow mask is shown in FIG. 3. Here the transport layer (6) and the photogate layer (7) are deposited though an undercut mask (9) being 0.5-100 mm high.

Patterning the layers by deposition through small apertures in shadow masks may be difficult for realizing small feature sizes (<10 μm) and may not be achievable over large area substrates (>30 cm). Hence, achieving high performance electronic circuits over large areas may not be feasible by shadow masking. Other patterning methods may have to be devised. Photolithographic processes admit smaller features (<1 μm), but are difficult to control over large area and flexible substrates. Integrated shadow masks need photolithographic processes as well. Hence, direct printing technologies, such as organic vapor jet patterning (OVJP) may be employed.

The layer sequence described above is purely illustrative and not meant to limit the scope of the invention. Configurations of the layers may be different from the one described above, for example: first a photogate layer (7) and a reset electrode (8), then a transport layer (6), then a source electrode (4) and a drain electrode (5), then a gate insulator (3) and then a gate electrode (2). Some alternative configurations are described in below.

Figure 4:
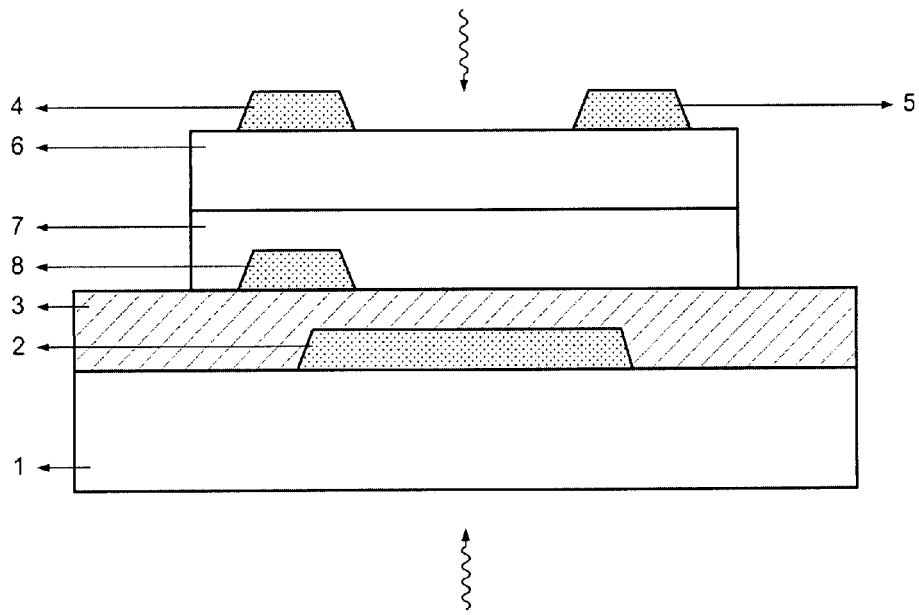
FIG. 4 is a cross-sectional view of an organic photo-detecting field-effect device, where 1 is the substrate, 2 is the gate electrode, 3 is the gate insulator, 4 is the source electrode, 5 is the drain electrode, 6 is the transport layer, 7 is the photogate layer and 8 is the reset electrode.

In FIG. 4, a configuration for the organic photo-detecting field-effect device is shown where the source electrode (4) and the drain electrode (5) are positioned on top of the transport layer (6), which is positioned on top of the photogate layer (7). In this configuration the charge build-up by illumination is realized in the organic semi-conducting layer closest to the gate insulator (3), while the transistor current is flowing in the organic semi-conducting layer further away from the gate insulator (3). The reset electrode (8) is in this configuration positioned on top of the gate insulator (3), in electrical contact with the photogate layer (7).

Figure 5:
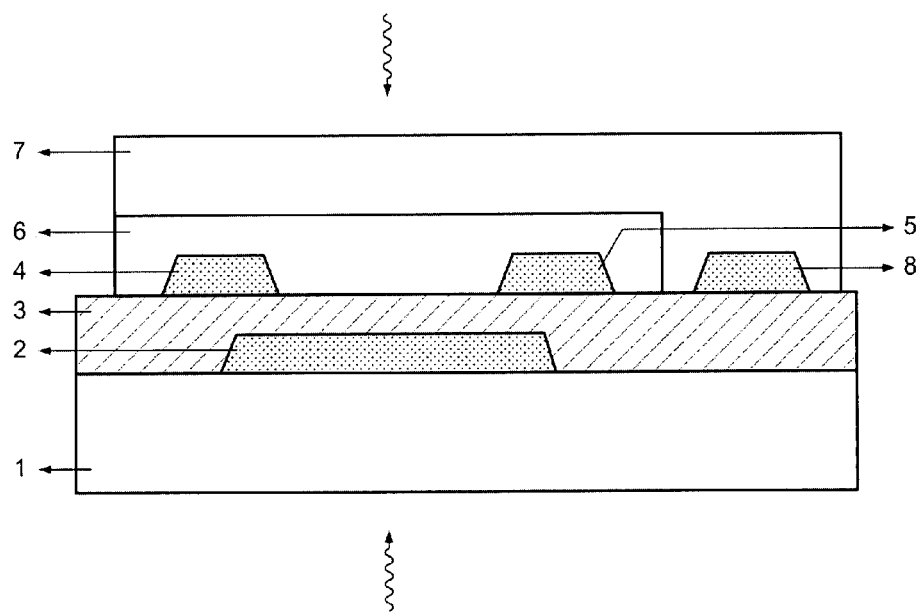
FIG. 5 is a cross-sectional view of an organic photo-detecting field-effect device, wherein 1 is the substrate, 2 is the gate electrode, 3 is the gate insulator, 4 is the source electrode, 5 is the drain electrode, 6 is the transport layer, 7 is the photogate layer and 8 is the reset electrode.

In FIG. 5 the source electrode (4), the drain electrode (5) and the reset electrode (8) are all positioned on top of the gate insulator (3). In this configuration, the source electrode (4), the drain electrode (5) and the reset electrode (8) may be processed in the same processing step.

Figure 6:
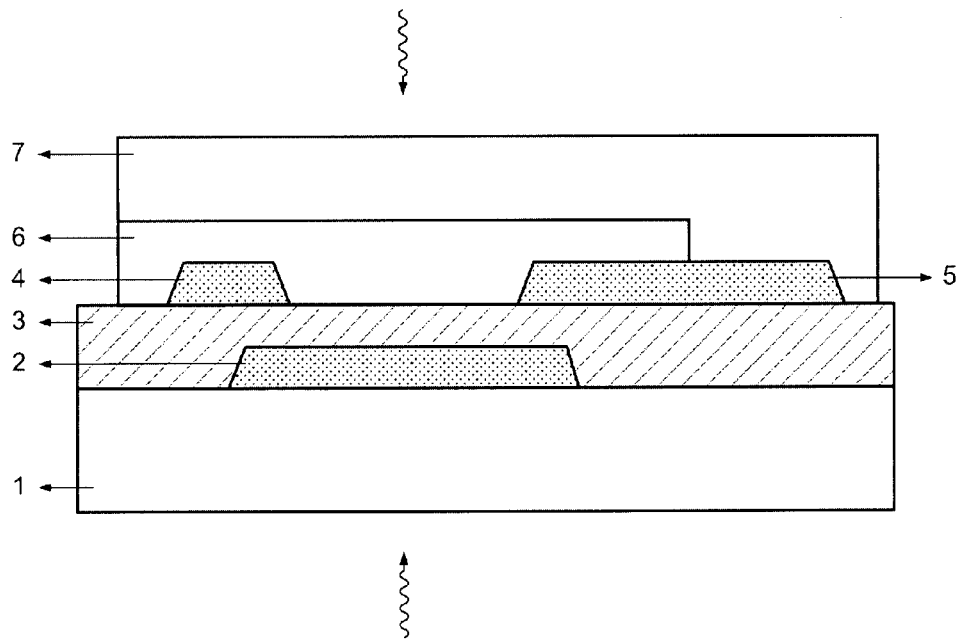
FIG. 6 is a cross-sectional view of an embodiment of an organic photo-detecting field-effect device, wherein 1 is the substrate, 2 is the gate electrode, 3 is the gate insulator, 4 is the source electrode, 5 is the drain electrode serving as reset electrode as well, 6 is the transport layer and 7 is the photogate layer.

In FIG. 6 the drain electrode (5) makes direct contact with the photogate layer (7) and the reset electrode is omitted. During the charging period of the device, the charge carriers accumulated in the photogate layer (7) are prevented from flowing to the drain electrode (5) by an energy barrier caused by applying a voltage to the drain electrode (5) that is repellent for this type of charge carriers. These charge carriers therefore collect in the vicinity of the source electrode (4). During the reset period of the device, the drain electrode (5) may be oppositely biased to attract the charge carriers collected in the photogate layer (7) and to remove them from the device.

Figure 7:
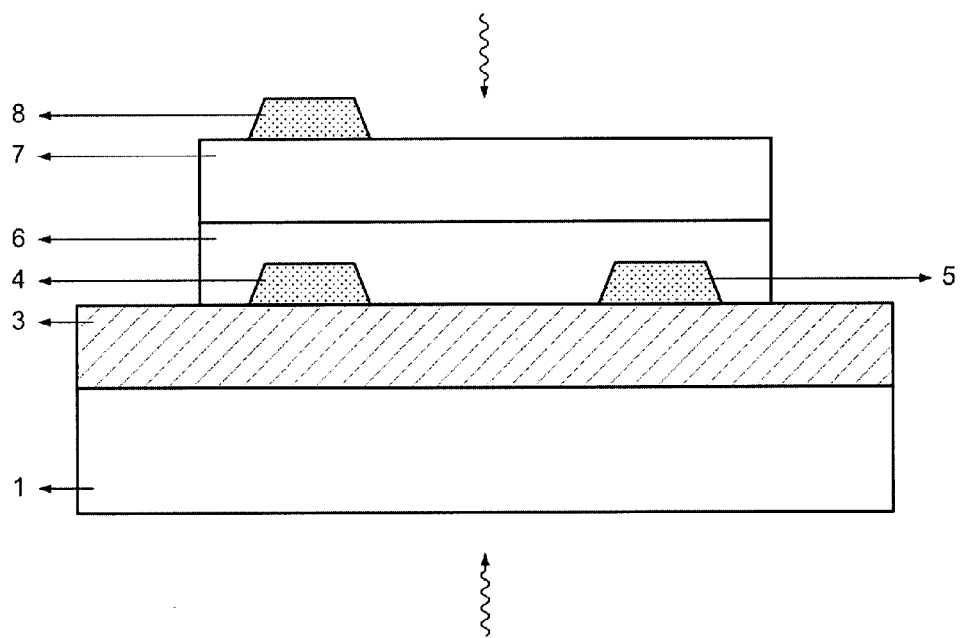
FIG. 7 is a cross-sectional view of an embodiment of an organic photo-detecting field-effect device, wherein 1 is the substrate, 3 is the gate insulator, 4 is the source electrode, 5 is the drain electrode, 6 is the transport layer, 7 is the photogate layer and 8 is the reset electrode.

Yet another embodiment is a gate-less device with lateral conduction between a source electrode (4) and a drain electrode (5), and a heterojunction between a transport layer (6) and a photogate layer (7), of which an example is shown in FIG. 7. The photogate layer (7) is charged by illumination and is discharged by a reset electrode (8).

Figure 8:
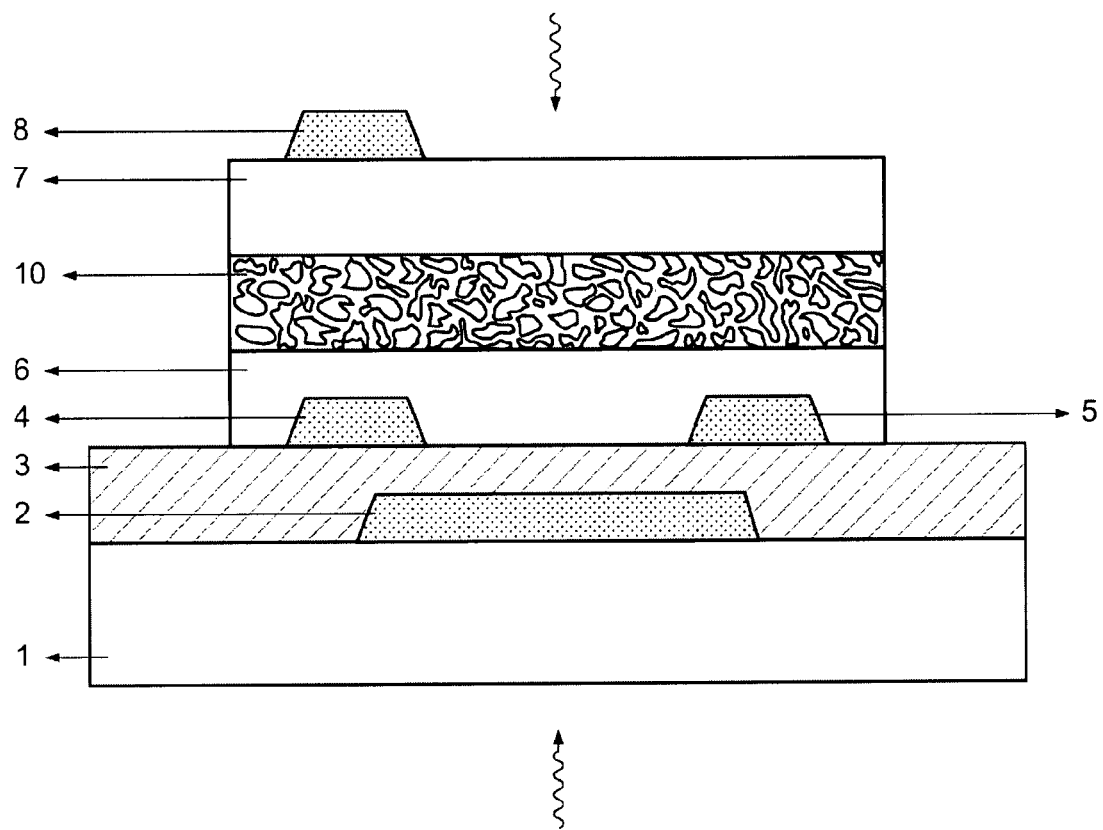
FIG. 8 is a cross-sectional view of an organic photo-detecting field-effect device, wherein 1 is the substrate, 2 is the gate electrode, 3 is the gate insulator, 4 is the source electrode, 5 is the drain electrode, 6 is the transport layer, 7 is the photogate layer, 8 is the reset electrode and 10 is the bulk junction layer.

In FIG. 8 a bulk junction layer (10) is incorporated between a transport layer (6) and a photogate layer (7). This bulk junction layer (10) may be formed by two or more materials, which may be, but do not have to be, the same materials as the transport layer (6) and the photogate layer (7). The bulk junction layer (10) has a high interface area between two or more materials, so the splitting of excitons in free charge carriers may be highly efficient. Still the transport layer (6) blocks the charge carriers accumulated in the photogate layer (7) from reaching the source and drain electrodes (4) directly during the charging period of the device.

Figure 9A:
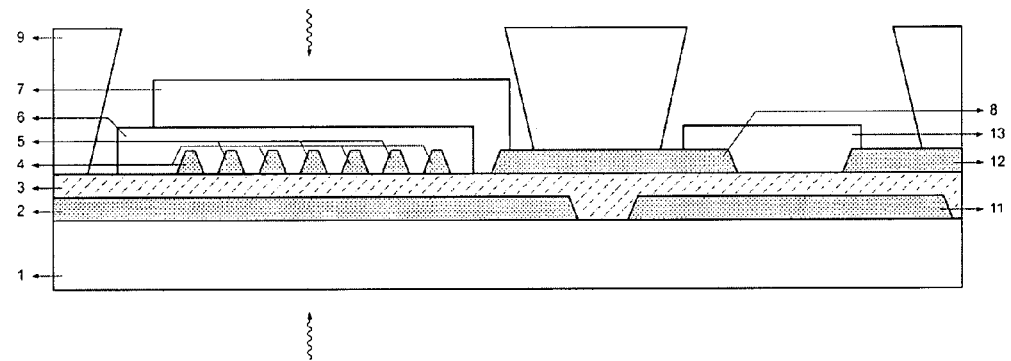
FIG. 9a is a cross-sectional view of an organic photo-detecting field-effect device integrated with an organic field-effect transistor on the same substrate. For the organic photo-detecting field-effect device, 1 is the substrate, 2 is the gate electrode, 3 is the gate insulator, 4 is the source electrode, 5 is the drain electrode, 6 is the transport layer, 7 is the photogate layer, 8 is the reset electrode serving as drain electrode of the organic field-effect transistor as well and 9 is the integrated shadow mask. For the organic field-effect transistor, 11 is the gate electrode, 12 is the source electrode, 8 is the drain electrode, and 13 is the transport layer.
Figure 9B:
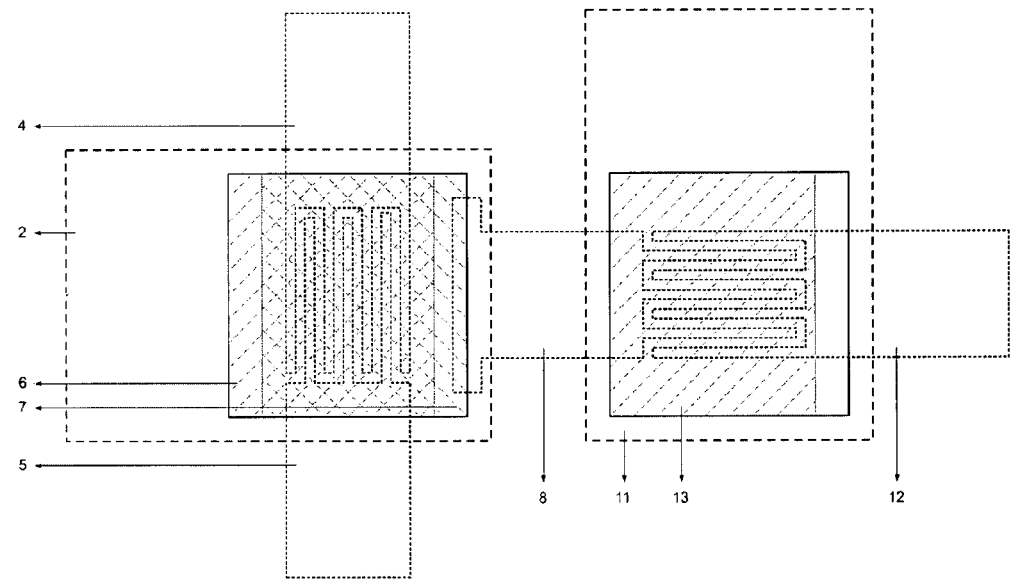
FIG. 9b is a top view of the embodiment shown in FIG. 9a of the organic photo-detecting field-effect device integrated with an organic field-effect transistor on the same substrate.

FIGS. 9a and 9b illustrate respectively the cross-sectional view and the top view of a possible integration of the organic photo-detecting field-effect device with an organic field-effect transistor on the same substrate. The reset electrode (8) of the organic photo-detecting field-effect device serves as the drain electrode of an organic field-effect transistor as well. The source electrode (4) and the drain electrode (5) form an interdigitated fork structure. The transport layer (6) is deposited under an angle through the integrated shadow mask (9), such that this transport layer (6) does not make contact to the reset electrode (8). During the same deposition step, the transport layer (13) of the organic field-effect transistor may be deposited through the same integrated shadow mask (9). The transport layer (13) of the organic field-effect transistor may also be deposited during a preceding or a subsequent deposition step and may be a different material than the transport layer (6) of the organic photo-detecting field-effect device. The photogate layer (7) is deposited under a different angle through the integrated shadow mask (9), such that this photogate layer (7) makes contact to the reset electrode (8). During this deposition step the organic field-effect transistor may be shielded with an external shadow mask to avoid the deposition of the photogate material on the transport layer (13) of the organic field-effect transistor. During the charging period of the organic photo-detecting field-effect device, the gate (11) of the organic field-effect transistor is biased such that there flows no current through the organic field-effect transistor between the source electrode (12) of the organic field-effect transistor and the reset electrode (8). During this charging period charge carriers are accumulated in the photogate layer (7) and the reset electrode (8). If illumination influences the characteristics of the field-effect transistor in a sufficient way to complicate its operation, it should be shielded from illumination to overcome this problem. During the reset period, the gate (11) of the organic field-effect transistor is biased such that a current flows through the transport layer (13) of the organic field-effect transistor between the source electrode (12) of the organic field-effect transistor and the reset electrode (8) to remove the collected charge carriers from the photogate layer (7) and the reset electrode (8). The reset electrode (8) is preferably sufficiently small to avoid spreading out of photo-generated carriers over a big area and to confine the collected charge carriers to the region between the source electrode (4) and the drain electrode (5) of the organic photo-detecting field-effect device. On the other hand, the reset electrode (8) is preferably not too small to assure a fast removal of the collected charge carriers during the reset period.

Figure 10:
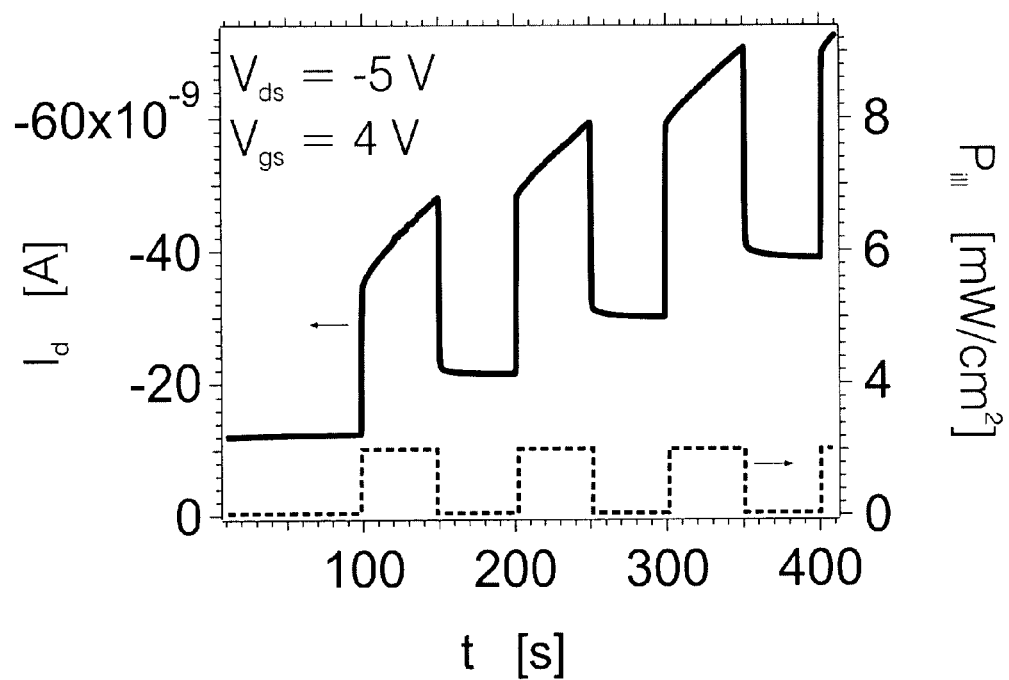
FIG. 10 is a graph of the variation in the drain current through an organic photo-detecting field-effect device, measured during illumination with light pulses of 50 s. The device was realized with a pentacene transport layer and a PDCTI-$C_{13}H_{27}$ photogate layer. The gate-source voltage was fixed at 4 V, and the drain-source voltage at −5 V. Illumination was realized with a broadband Xenon lamp and the illumination intensity on the device was 2 mW/cm$^2$.

The organic photo-detecting field-effect device as described above allows the realization of a high gain organic photodetector. In FIG. 10 the measured characteristics of a device corresponding to an embodiment as shown in FIG. 9, but without field-effect transistor, is represented. The device is illuminated with light pulses of 50 s and is continuously biased with a gate-source voltage of 5 V. In this embodiment the gate electrode (2) is a highly n-doped silicon wafer simultaneously serving as substrate (1). The gate insulator (3) is a layer of silicon dioxide of 100 nm thick, with an octadecyltrichlorosilane surface treatment. The source and drain electrodes (4) consist of Au and form an interdigitated fork structure. The transport layer (6) is 30 nm thick and consists of pentacene. The photogate layer (7) is 450 nm thick and consists of $PDCTI-Q_{13}H_{27}$. The device was illuminated with the broad spectrum of a Xenon lamp. Photogenerated holes are collected in the pentacene transport layer (6) and conducted towards the drain electrode (4). The steep rise in the drain current coinciding with the switch-on of the illumination pulses corresponds to the drain current from the direct photogenerated holes. Photogenerated electrons are collected in the $PDCTI-C_{13}H_{27}$ photogate layer (7). During illumination these electrons gradually shift the threshold voltage of the transistor. This threshold voltage shift is responsible for an additional gradual rise in drain current during the periods that the illumination is switched on. When illumination stops, the electrons in the photogate layer (7) stay in this layer. An elevated level of the drain current can be seen with respect to the starting level. The electrons collected in the $PDCTI-C_{13}H_{27}$ layer stay there till they are removed during the reset period (not shown in FIG. 10).

Figure 11:
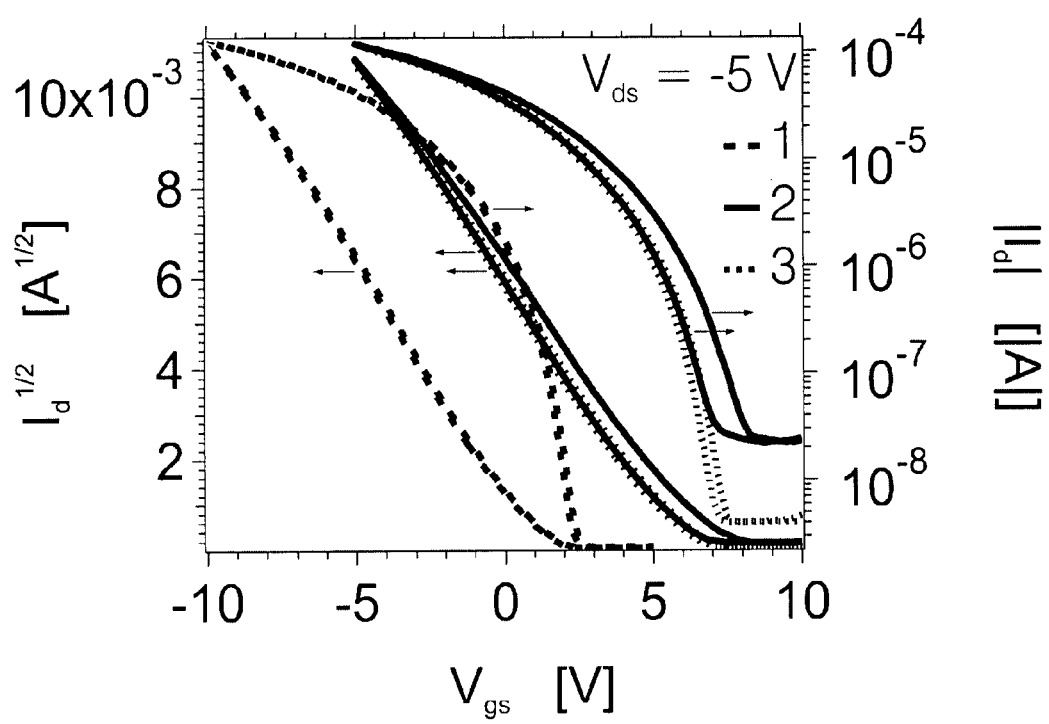
FIG. 11 is a graph showing three different drain current versus gate-source voltage curves, measured for an organic photo-detecting field-effect device realized with a pentacene transport layer and a PDCTI-$C_{13}H_{27}$ photogate layer. The drain-source voltage was set to −5 V, illumination was realized with a broadband Xenon lamp and the illumination intensity on the device was 2 mW/cm$^2$. Curve 1 is a drain current versus gate-source voltage curve measured before illumination, curve 2 is a drain current versus gate-source voltage curve measured during illumination and curve 3 is a drain current versus gate-source voltage curve measured after illumination.

In FIG. 11 the measured drain current as a function of the gate-source voltage is shown (1) before, (2) during and (3) after illumination with an illumination power of 2 $mW/cm^2$ during 50 s. The device configuration is identical to the device measured in FIG. 10. As can be seen, the mobility and the subthreshold slope of the device before and after illumination do not change. The effect of the collection of charge carriers in the $PDCTI-C_{13}H_{27}$ photogate layer (7) is only a shift in threshold voltage and an equal shift in pinch-off voltage towards more positive voltages. Obviously, the highest ratio of the drain current after illumination and the drain current before illumination, which may be related to signal-to-noise ratio of the organic photo-detecting field-effect device, is achieved around the initial pinch-off voltage, which is 2.5 V in FIG. 11. As the transistor is in cut-off at 2.5 V before illumination, the drain current before illumination is small. A small shift in pinch-off voltage by illumination causes a high rise in drain current.

The invention claimed is:

1. An organic photo-detecting field-effect device comprising:
   a first layer comprising a first organic semi-conducting material, the first organic semi-conducting material having a high charge carrier mobility for a first type of charge carriers;
   a source electrode in electrical contact with the first layer;
   a drain electrode in electrical contact with the first layer, whereby the source electrode and the drain electrode delineate a channel region entirely therebetween in the first layer;
   a second layer comprising a second material, the second material being conducting or semi-conducting, the second layer being in electrical and physical contact with the first layer at least in the channel region, and the second layer not being in electrical contact with the source electrode;
   a gate insulator in contact with at least one of the first layer and the second layer;
   a gate electrode in contact with the gate insulator and electrically isolated from the source electrode, the drain electrode, the first layer and the second layer; and
   means for removing a second type of charge carriers oppositely charged from the first type of charge carriers from the second layer.

2. The organic photo-detecting field-effect device according to claim 1, wherein, upon illumination, excitons are photo-generated and split into free charge carriers, wherein the second layer accumulates a second type of charge carriers oppositely charged from the first type of charge carriers, and wherein the first layer accumulates the first type of charge carriers and transports the first type of charge carriers between the source electrode and the drain electrode.

3. The organic photo-detecting field-effect device according to claim 1, wherein the second material is a second organic semi-conducting material, forming an organic heterojunction at an interface between the first layer and the second layer.

4. The organic photo-detecting field-effect device according to claim 1, wherein the second material is a metal that forms a Schottky barrier at an interface between the first layer and the second layer.

5. The organic photo-detecting field-effect device according claim 1, wherein an interface between the first layer and the second layer is substantially a planar junction.

6. The organic photo-detecting field-effect device according to claim 1, wherein an interface between the first layer and the second layer is a bulk junction, being a three-dimensional network wherein the first material and the second material are intermixed.

7. The organic photo-detecting field-effect device according to claim 1, the device further comprising a reset electrode in electrical contact with the second layer.

8. The organic photo-detecting field-effect device according to claim 1, wherein the source electrode is a first fork-shaped structure and wherein the drain electrode is a second fork-shaped structure, the first fork-shaped structure and the second fork-shaped structure forming an interdigitated fork structure.

9. An image sensor comprising an array of a plurality of organic photo-detecting field-effect devices, each such device comprising:
- a first layer comprising a first organic semi-conducting material, the first organic semi-conducting material having a high charge carrier mobility for a first type of charge carriers;
- a source electrode in electrical contact with the first layer;
- a drain electrode in electrical contact with the first layer, whereby the source electrode and the drain electrode delineate a channel region entirely therebetween in the first layer;
- a second layer comprising a second material, the second material being conducting or semi-conducting, the second layer being in electrical and physical contact with the first layer at least in the channel region, the second layer not being in electrical contact with the source electrode;
- a gate insulator in contact with at least one of the first layer and the second layer;
- a gate electrode in contact with the gate insulator and electrically isolated from the source electrode, the drain electrode, the first layer and the second layer; and
- means for removing a second type of charge carriers oppositely charged from the first type of charge carriers from the second layer.

10. The image sensor of claim 9, and a product selected from the group consisting of a camera, a scanner, a medical image sensor array, and an industrial image sensor array, wherein the image sensor of claim 9 is an image sensor of the product.

11. An organic photo-detecting field-effect device comprising:
- a first layer comprising a first organic semi-conducting material, the first organic semi-conducting material having a high charge carrier mobility for a first type of charge carriers;
- a source electrode in electrical contact with the first layer;
- a drain electrode in electrical contact with the first layer, whereby the source electrode and the drain electrode delineate a channel region entirely therebetween in the first layer;
- a second layer comprising a second material, the second material being conducting or semi-conducting, the second layer being in electrical and physical contact with the first layer at least in the channel region, the second layer not being in electrical contact with the source electrode; and
- a reset electrode in electrical contact with the second layer for removing a second type of charge carriers from the second layer, the second type of charge carriers having opposite charge compared to the first type of charge carriers.

* * * * *